United States Patent
Klein

(10) Patent No.: US 10,740,175 B2
(45) Date of Patent: Aug. 11, 2020

(54) POOL-LEVEL SOLID STATE DRIVE ERROR CORRECTION

(71) Applicant: Toshiba Memory Corporation, Minato-ku, Tokyo (JP)

(72) Inventor: Yaron Klein, Raanana (IL)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/230,888

(22) Filed: Dec. 21, 2018

(65) Prior Publication Data

US 2019/0121690 A1    Apr. 25, 2019

Related U.S. Application Data

(63) Continuation of application No. 15/205,248, filed on Jul. 8, 2016, now Pat. No. 10,180,875.

(51) Int. Cl.
*G06F 11/10*     (2006.01)
*G11C 29/52*     (2006.01)
(Continued)

(52) U.S. Cl.
CPC ...... *G06F 11/1044* (2013.01); *G06F 11/1012* (2013.01); *G06F 11/1072* (2013.01);
(Continued)

(58) Field of Classification Search
CPC .................. G06F 11/1044; G06F 11/1012
See application file for complete search history.

(56) References Cited

U.S. PATENT DOCUMENTS 5,058,115 A * 10/1991 Blake .................. G06F 11/1052
                                                    714/767
5,418,796 A *  5/1995 Price .................. G06F 11/1028
                                                    714/753
(Continued)

FOREIGN PATENT DOCUMENTS

WO    2015108670 A1    7/2015

OTHER PUBLICATIONS http://blog.macsales.com/14256-owc-announces-mercury-electra-max-3g-960gb-solid-state-drive; "OWC Announces Mercury Electra MAX 3G 960GB Solid State Drive"; Other World Computing (OWC); pp. 1-4; Jun. 22, 2012.

(Continued)

*Primary Examiner* — Steve N Nguyen
(74) *Attorney, Agent, or Firm* — White & Case LLP

(57) ABSTRACT

A method for performing error correction for a plurality of storage drives and a storage appliance comprising a plurality of storage devices is disclosed. In one embodiment, the method includes generating a first set of parity bits from a first set of data of at least one of the plurality of storage devices, the first set of parity bits capable of correcting a first number of error bits of the first set of data. The method further includes generating a second set of parity bits from a concatenated set of the first data and a second set of data from at least another of the plurality of storage devices, the second set of parity bits capable of correcting a second number of error bits of the first set of data, the second number being greater than the first number. The method further includes reading the first set of data and (i) correcting error bits within the first set of data with the first set of parity bits where a number of error bits is less than the first number of error bits; and (ii) correcting error bits within the first set (Continued)

of data with the second set of parity bits where the number of error bits is greater than the first number.

23 Claims, 8 Drawing Sheets

(51) Int. Cl.
*H03M 13/29* (2006.01)
*H03M 13/15* (2006.01)
*H03M 13/11* (2006.01)

(52) U.S. Cl.
CPC ......... *G11C 29/52* (2013.01); *H03M 13/2906* (2013.01); *H03M 13/1102* (2013.01); *H03M 13/152* (2013.01); *H03M 13/1515* (2013.01)

(56) References Cited

U.S. PATENT DOCUMENTS

| | | | |
|---|---|---|---|
| 6,952,797 B1 * | 10/2005 | Kahn | G06F 11/1076 714/758 |
| 7,103,824 B2 | 9/2006 | Halford | |
| 7,657,823 B1 | 2/2010 | Tang et al. | |
| 7,941,696 B2 * | 5/2011 | Frost | G06F 11/1068 714/6.2 |
| 8,181,089 B1 | 5/2012 | Fernandes et al. | |
| 8,230,316 B2 * | 7/2012 | Melliar-Smith | H03M 13/2918 714/801 |
| 8,381,076 B2 * | 2/2013 | Radke | H03M 13/05 714/758 |
| 8,386,717 B1 * | 2/2013 | Banerjee | G06F 12/123 711/118 |
| 8,392,752 B2 | 3/2013 | Ikeuchi et al. | |
| 8,473,780 B2 | 6/2013 | Shalvi | |
| 8,516,343 B2 | 8/2013 | Flynn et al. | |
| 8,656,257 B1 | 2/2014 | Micheloni et al. | |
| 8,862,800 B2 * | 10/2014 | Resch | G06F 3/0617 710/74 |
| 9,063,910 B1 * | 6/2015 | Hallak | G06F 11/1092 |
| 9,116,823 B2 | 8/2015 | Fillingim et al. | |
| 9,152,499 B1 | 10/2015 | Mollov et al. | |
| 9,158,617 B2 | 10/2015 | Cho et al. | |
| 9,170,897 B2 | 10/2015 | Losh et al. | |
| 9,244,836 B2 * | 1/2016 | Sartore | G06F 12/0246 |
| 2003/0066010 A1 * | 4/2003 | Acton | G11B 20/18 714/758 |
| 2011/0202792 A1 | 8/2011 | Atzmony | |
| 2012/0233498 A1 * | 9/2012 | Ramaraju | G06F 11/1064 714/23 |
| 2012/0278687 A1 * | 11/2012 | Sharon | G06F 11/1048 714/790 |
| 2013/0242656 A1 * | 9/2013 | Sakaue | G06F 11/1048 365/185.09 |
| 2015/0032956 A1 | 1/2015 | Huang | |

OTHER PUBLICATIONS

"DuraClass Technology"; Seagate; available at: (http://www.seagate.com/in/en/tech-insights/duraclass-technology-master-ti/; Seagate) pp. 1-9 (Jan. 2016).

http://enterprise.huawei.com/ilink/cnenterprise/download/HW_131858; "OceanStor Dorado2100&5100 Technical White Paper"; Huawei Technologies Co., Ltd.; May 7, 2012.

"SandForce® SF2600 and SF2500 Enterprise"; Seagate; Aug. 22, 2014.

"Ultrastar™ SSD800MH Enterprise Solid State Drives"; HGST; Apr. 8, 2013.

RamSan 440, Solid State Disks Ltd (SSD) by Reactive Group, pp. 1-3, Jan. 25, 2016.

* cited by examiner

POOL-LEVEL SOLID STATE DRIVE ERROR CORRECTION

CROSS-REFERENCE TO RELATED CASES

This application is a continuation of application Ser. No. 15/205,248 filed Jul. 8, 2016, the entire contents of which is incorporated herein by reference.

FIELD OF THE INVENTION

This invention generally relates to error correction for flash devices, and more specifically, enhanced error correction for solid state drive (SSD) based storage appliances and open-channel SSD based storage appliances.

BACKGROUND OF THE INVENTION

The reduction in size of semiconductor process geometries and the use of multi-level cell techniques in NAND flash memory technology has significantly increased the bit density and reduced the cost per bit, resulting in the widespread adoption of flash memory-based storage for diverse applications from personal mobile devices to enterprise storage systems. With the increase in bit density, there is a reduction in reliability and robustness, with increased propensity for errors and reduced longevity. Flash memory error rates are known to increase with: (i) the number of program/erase cycles the memory has been subjected to; (ii) the length of time the data has been stored; and (iii) the use of smaller cell geometries and multi-level cell techniques. This has meant that stronger Error Correcting Codes (ECCs) to detect and correct bit errors are required to compensate for the increased error rates and reduced longevity.

NAND flash memories generally employ a systematic ECC, which is formed by adding redundant bits (often called parity bits) to the data bits according to a deterministic encoding algorithm. The original data bits, along with the extra parity bits, are then stored in the memory. Upon reading, the data bits and parity bits are passed through a decoding algorithm which either provides data bits which have been corrected for errors, or otherwise, an indication that an uncorrectable error has been detected (when the number of errors exceeds the error correcting capability of the code) in which case it is generally not possible to say which data bits are correct and which are not and a read failure occurs. Such codes are also called Forward Error Correcting (FEC) codes as the parity bits are added in advance of the data actually being stored.

As the bit density of data stored in NAND flash memory has increased, so has the complexity and sophistication of the ECC algorithms employed increased, from Hamming codes for SLC (Single Level Cell) memories, to Bose-Chaudhuri-Hocquenghem (BCH) codes for MLC (Multi-Level Cell) memories. to Low Density Parity Check (LDPC) codes for TLC (Tri-Level cell) and sub-20 nanometer cell geometry memories.

It is also possible for the number of errors to exceed the error correcting capability of the ECC to such an extent that the decoding process mis-decodes the data to a completely different set of data bits than those originally encoded. In some rare cases, it may even be possible with some ECC schemes (notably LDPC codes) for the number of errors to be quite small, yet the decoding process can mis-decode the data in a similar way. To detect these decoding errors, checksum bits are generally added to the original data using, for example, Cyclic Redundancy Check (CRC) code bits, or by adding an outer layer of secondary ECC scheme (particularly when LDPC is used). After the data is decoded using the ECC, a final check of the correctness of the data is made using the CRC decoder or the secondary ECC scheme. Even if the ECC decoder apparently decodes correctly, if the CRC or secondary ECC decoding fails, an unrecoverable error is returned. Hence, despite the increased error detection and correction capability of the more sophisticated ECC algorithms employed in combination with CRC checksum bits or secondary ECC schemes, it still remains possible for unrecoverable errors to occur.

An Open-Channel SSD is a type of SSD which has the ability to leave certain aspects of the management of the physical solid-state storage, such as the Flash Translation Layer (FTL), to the host device to which the open-channel SSD is connected. The ECC may also either be implemented at the device level, or left to the host to handle. Linux™ 4.4 kernel is an example of an operating system kernel that supports open-channel SSDs which follow the NVM Express™ specification, by providing an abstraction layer called LightNVM.

Moving from a single SSD into a storage appliance comprising an array of SSDs, the biggest threat at the array level is disk failure, which may be when a read operation fails (typically when an uncorrectable error occurs) or when an entire SSD malfunctions for some reason. As indicated, in the event of an unrecoverable error or disk failure occurring, it becomes impossible to retrieve any meaningful data from the failing SSD, and so the problem is commonly addressed by storing data across a group of disks within the whole array of SSDs such that data may be recovered from a subset of the disks in the group containing the failing disk. An erasure code (EC) is a FEC code for the binary erasure channel, which transforms a message of k symbols into a longer message (code word) with n symbols, such that the original message can be recovered from a subset of the n symbols. Popular erasure codes for SSD based storage appliances and other devices utilizing arrays of SSDs are Redundant Array of Independent Disks (RAID)-5 and RAID-6 configurations.

RAID-5 consists of block-level striping with distributed parity across the array. Upon failure of a single disk, subsequent reads can be calculated from the distributed parity such that no data is lost. RAID-6 extends RAID-5 by adding another parity block; thus it uses block-level striping with two parity blocks distributed across all member disks. EC utilization is the ratio between parity disks and data disks, e.g., 4+1 RAID-5 has a 20% overhead. Moreover, traditional RAID configurations do not take advantage of the global FTL that is possible with an array of open-channel SSDs.

There is, therefore, an unmet demand for a pool-level or global ECC mechanism for an array of SSDs within a storage appliance with reduced parity overhead, and for global ECC to be integrated into the global FTL for an array of open-channel SSDs within a storage appliance to increase operational efficiency.

BRIEF DESCRIPTION OF THE INVENTION

In one embodiment, a method for performing error correction for a plurality of storage drives includes generating a first set of parity bits from a first set of data of at least one of the plurality of storage devices, the first set of parity bits capable of correcting a first number of error bits of the first set of data. The method further includes generating a second set of parity bits from a concatenated set of the first data and a second set of data from at least another of the plurality of storage devices, the second set of parity bits capable of correcting a second number of error bits of the first set of data, the second number being greater than the first number. The method further includes reading the first set of data and (i) correcting error bits within the first set of data with the first set of parity bits where a number of error bits is less than the first number of error bits; and (ii) correcting error bits within the first set of data with the second set of parity bits where the number of error bits is greater than the first number.

In one embodiment, the first set of data includes a checksum for indicating whether the first set of parity bits has corrected the first set of data, and if not, correcting error bits within the first set of data with the second set of parity bits. In one embodiment, the method further includes generating a mapping table containing locations of the first set of data, the second set of data corresponding to the concatenated set used to generate the second set of parity bits, and the second set of parity bits within the plurality of storage devices. In one embodiment, the plurality of storage devices comprise SSDs.

In one embodiment, the method further includes storing the first set of data and the first set of parity bits in a first location within one or more memory devices of the at least one of the plurality of storage devices, and storing the second set of parity bits in a second location within the one or more memory devices of the plurality of storage devices. The first and second storage locations may correspond to different NAND pages within the one or more flash memory devices of the plurality of storage devices.

In one embodiment, the first set of parity bits and second set of parity bits are BCH parity bits. In another embodiment, the first set of parity bits and second set of parity bits are Hamming parity bits. In yet another embodiment, the first set of parity bits and second set of parity bits are Reed-Soloman parity bits. In yet another embodiment, the first set of parity bits and second set of parity bits are LDPC parity bits.

In one embodiment, a storage appliance comprises a controller communicatively coupled to a plurality of storage devices. At least one of the plurality of storage devices is configured to correct a first number of error bits of a first set of data with a first set of parity bits when the first set of data is read by the controller, the first set of parity bits generated from the first set of data. The controller is further configured to correct a second number of error bits greater than the first number of the first set of data with a second set of parity bits when the number of error bits exceeds the first number, the second set of parity bits generated from a concatenated set of the first set of data and at least one second set of data of at least one other of the plurality of storage devices.

In one embodiment, the first set of data includes a checksum indicating whether the first set of parity bits has corrected the first set of data, and if not, returning an unrecoverable error message to the controller. In one embodiment, the controller is configured to store and update a mapping table containing locations of the first set of data and the at least one second set of data corresponding to the concatenated set used to generate the second set of parity bits, and the second set of parity bits within the plurality of storage devices. In one embodiment, the plurality of storage devices comprise SSDs.

In one embodiment, the first set of parity bits are stored in a first location within one or more memory devices of the at least one of the plurality of storage devices, and the second set of parity bits are stored in a second location within the one or more memory devices of the plurality of storage devices. In one embodiment, the first location and the second location correspond to different flash pages within the one or more flash memory devices of the plurality of storage devices.

In one embodiment, the first set of parity bits and second set of parity bits are BCH parity bits. In another embodiment, the first set of parity bits and second set of parity bits are Hamming parity bits. In yet another embodiment, the first set of parity bits and second set of parity bits are Reed-Soloman parity bits. In yet another embodiment, the first set of parity bits and second set of parity bits are LDPC parity bits.

DETAILED DESCRIPTION OF THE INVENTION

Figure 1:
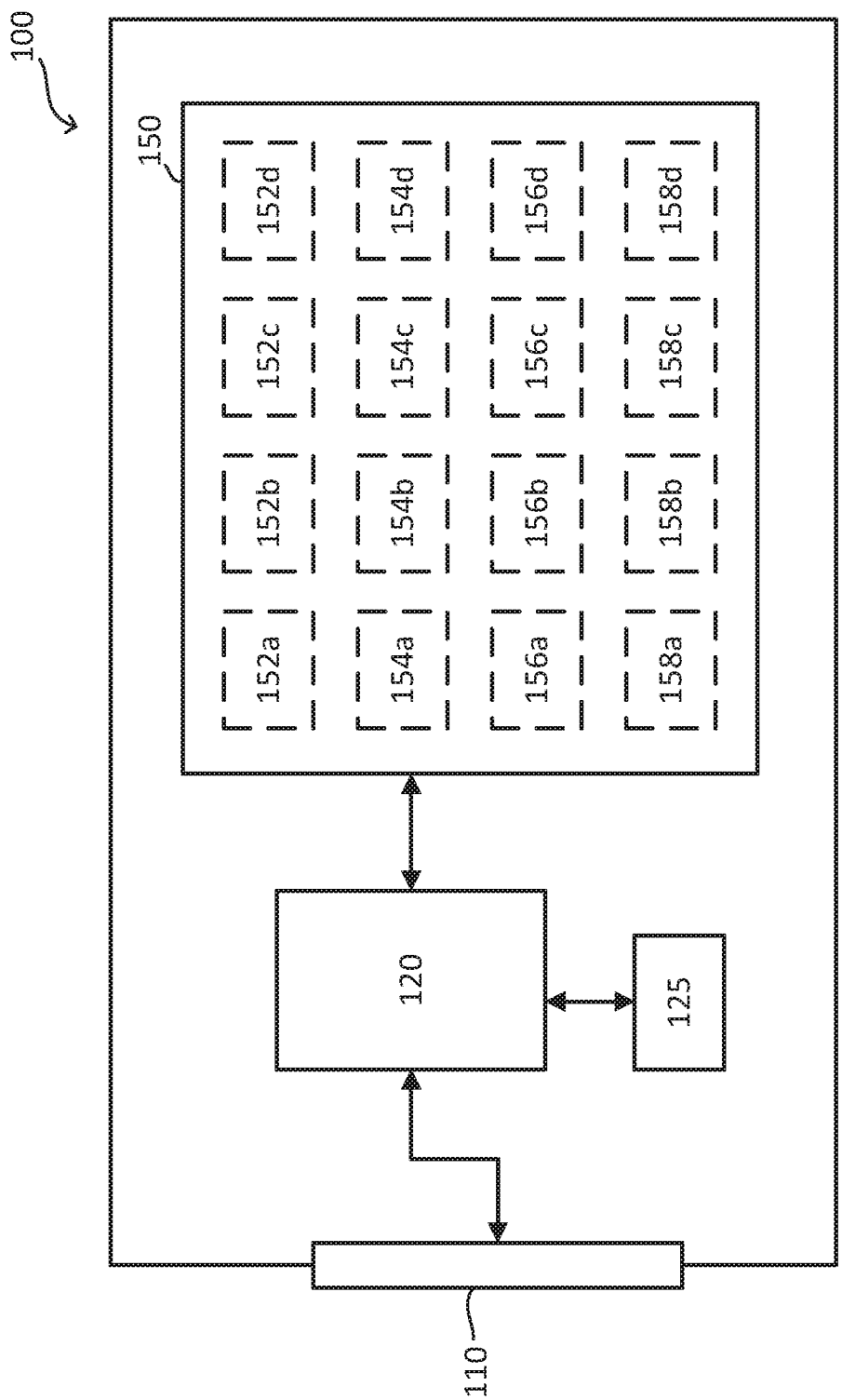
FIG. 1 is a physical block diagram of an SSD.

FIG. 1 is a physical block diagram of an SSD 100. As shown in FIG. 1, a memory controller 120 is in communication with a host device (not shown) through a host interface 110. The host device may comprise any suitable device, such as a computer or a storage appliance. The SSD 100 includes both a volatile memory 125 and an array of non-volatile memory devices 150. The volatile memory 125 and the non-volatile memory devices 150 are in communication with the memory controller 120. The array of non-volatile memory devices 150 comprises non-volatile memory devices 152a-d, 154a-d, 156a-d, and 158a-d that may be arranged in one or more channels in communication with the memory controller 120. In one embodiment, the volatile memory 125 comprises a volatile memory DRAM buffer. In one embodiment, the non-volatile memory devices 152a-d, 154a-d, 156a-d, and 158a-d comprise NAND flash memory.

In one embodiment, the SSD 100 is a conventional SSD whereby the firmware of the memory controller 120 implements the flash translation layer (FTL) to map logical blocks addresses (LBA) to physical pages and blocks of the non-volatile memory devices 152a-d, 154a-d, 156a-d, and 158a-d, and implements garbage collection and wear-leveling. In another embodiment, the SSD 100 is an open-channel SSD that is capable of sharing responsibilities with the host device in order to implement and maintain features that conventional SSDs keep strictly in firmware, such as the FTL, bad block management, and ECC. In this manner, open-channel SSD 100 exposes direct access to the non-volatile memory devices 152a-d, 154a-d, 156a-d, and 158a-d to the host device, while keeping a subset of the internal features of conventional SSDs.

Figure 2:
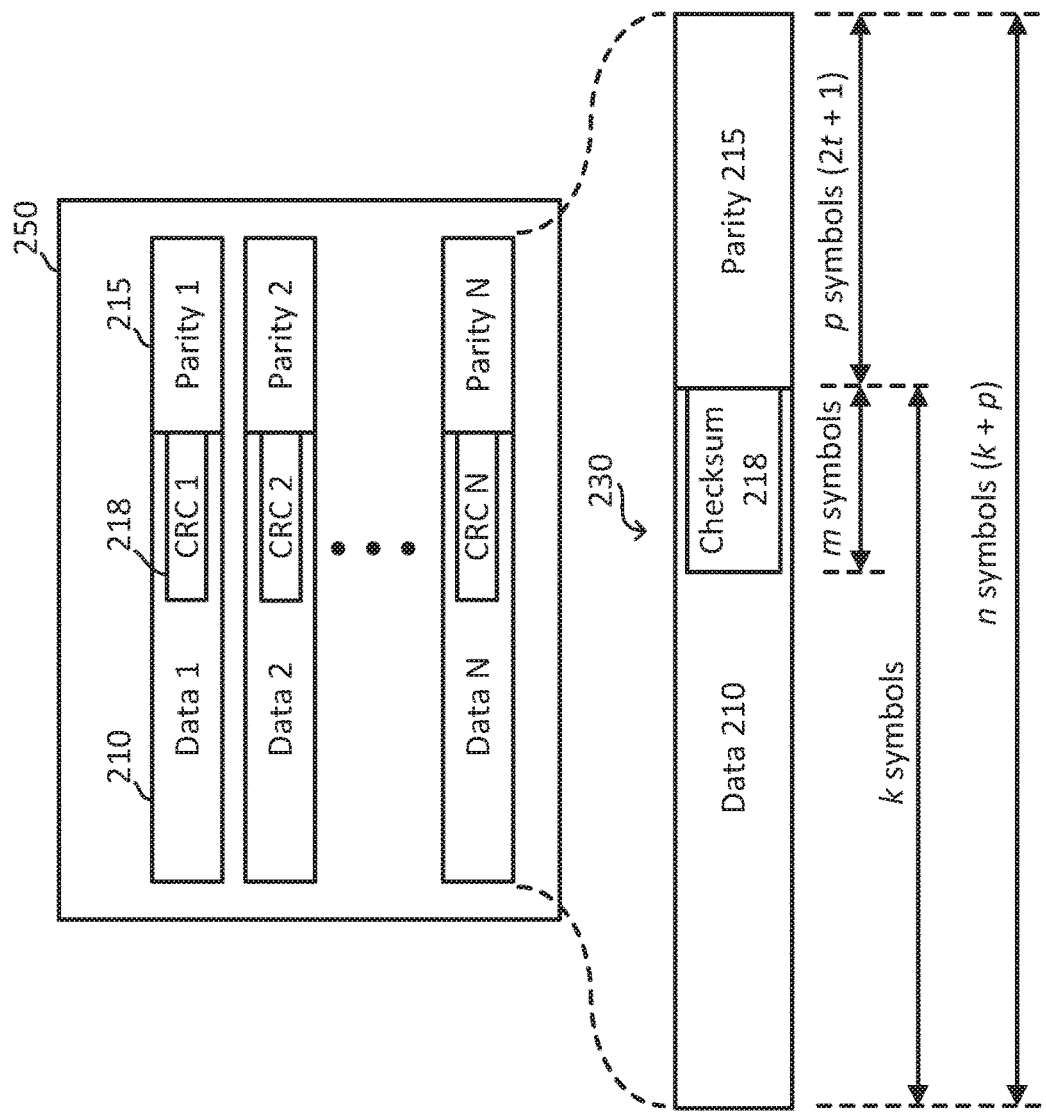
FIG. 2 is a block diagram of an error detection and correction scheme in an SSD.

FIG. 2 is a block diagram of an error detection and correction scheme in an SSD 250. As shown in FIG. 2, SSD 250 implements a systematic ECC, where the data block 210 of k symbols, which includes symbols of checksum 218, is encoded by generating p symbols of parity 215. The data block 210 and parity 215 are transmitted together as n symbols (k+p) of codeword 230. As shown in FIG. 2, k corresponds to the number of bits in the data to be encoded, and n refers to the number of bits in the ECC codeword 130.

The p symbols of parity 215 provide 2t+1 distance between transmitted codewords 230. This enables t bits of error for one codeword 230, and t bits in error for another codeword 230, and the resultant errored codewords 230 will have a difference of one bit and therefore be distinguishable. Thus, one codeword 230 with a maximum number of t bits in error cannot be mistaken for another codeword 230. The resultant ECC scheme is able to correct t bits in error from any codeword 230 (data block 210 plus parity 215). This ensures that when a read of the data block 210 is performed, up to t symbols in a selected codeword 230 can be in error, and the ECC decoding can distinguish between the selected codeword 230 and a different codeword 230 also with t symbols in error, thereby decoding the selected codeword 230 and recovering the original data block 210 (including the checksum 218).

As a final check, the checksum 218 (e.g., a Cyclic Redundancy Checksum (CRC)) is used to check the integrity of the data block 210. This is necessary because, if the number of errors exceeds t symbols when the data block 210 is read, the ECC decoding may decode the errored data to a different codeword 230 altogether and indicate a pass rather than a failure (a false positive decoding). By including a checksum 218, which is more likely to fail in this event, the risk that the decoded data block 210 will be mistaken as valid data is greatly reduced. In one embodiment, only when the ECC decoding and the CRC both pass with failure is the data block 210 returned by the SSD 250. If either ECC or CRC fail, an unrecoverable error (URE) is returned by the SSD 250.

For example, in one embodiment where the p symbols (2t+1) of parity 215 are BCH encoded bits and the SSD 250 applies ECC algorithm A(n, k, d), where the n bit codeword represents k bit words (data bits) that can correct d/2−1 bits, then an example of such a code may be (16534, 16384, 21), where 16384 data bits and 150 parity bits can recover 10 errored bits (t=10). In this example, the parity overhead is 0.8% (150 parity bits/16534 bit codeword). In other embodiments, the parity bits 215 may comprise Hamming parity bits, Reed-Soloman parity bits, or LDPC encoded bits.

As illustrated by FIG. 2, in an SSD 250 each data block 210 and CRC 218 may be programmed in the non-volatile memory devices with its corresponding parity 215. This enables the recovery of data block 210 from up to (and including) t symbols of error with the combined codeword 230 of data block 210, CRC 218, and parity 215. When the SSD 250 performs a read operation, data block 210, CRC 218 parity 215 and are fetched from the non-volatile memory devices and ECC decoding is applied. Then, the decoded CRC 218 validates the integrity of the decoded data block 210. If the integrity of the decoded data block 210 is validated by decoded CRC 218, then it is transferred to the host device. Otherwise, an unrecoverable error message is sent. The ECC scheme shown and described in FIG. 2 is local to an SSD device, such as SSD 250, and as such, may also be referred to as a local ECC.

Figure 3:
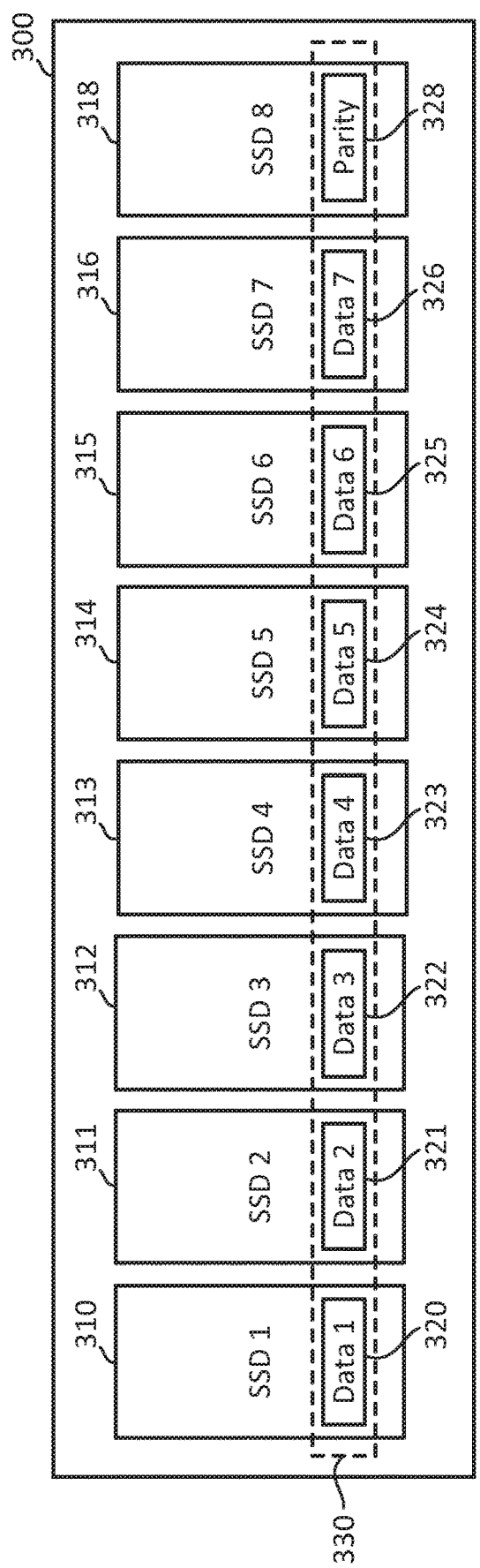
FIG. 3 is a block diagram of an EC mechanism for an array of SSDs within a storage appliance.

FIG. 3 is a block diagram of an EC mechanism for an array of SSDs 310-316 and 318 within a storage appliance 300. As shown in FIG. 3, the storage appliance 300 is populated with a plurality of SSDs 310-316 and 318. In one embodiment, the SSDs 310-316 and 318 are configured in a 7+1 RAID-5. In other embodiments, other RAID configurations for SSDs 310-316 and 318 are implemented, such as RAID-6. In the 7+1 RAID-5 configuration, each stripe of data 330 across the array of SSDs 310-316 and 318 contains 7 data chunks 320-326 and parity chunk 328. Parity chunk 328 is an exclusive OR (XOR) of data chunks 320-326. In this 7+1 RAID 5 configuration, the storage appliance 300 can recover from a failure of one of the SSDs 310-316. The corresponding data chunk 320-326 of the failed SSD 310-316 can be recovered using the parity chunk 328 by performing an XOR operation of the available data chunks 320-326 of the SSDs 310-316 that have not failed.

Each of the SSDs 310-316 may implement its own ECC mechanism, such as the ECC mechanism of SSD 250 shown and described in connection with FIG. 2. When the storage appliance 300 sends read commands to the SSDs 310-316, the memory controllers of the SSDs 310-316 reads data blocks from its respective non-volatile memory devices, and if the errored bits of the read data are less than t bits that are correctable with the ECC mechanism of the SSDs 310-316, and the integrity of the read data is verified by CRC, then the SSDs 310-316 sends the data to the storage appliance 300. If the errored bits of the read data are greater than t bits, the error is detected (via CRC) and an unrecoverable error message is sent to the storage appliance 300. In this case, the storage appliance 300 can send a read command to all of the other SSDs 310-316, and 318 for the appropriate data stripe 330. If these read commands succeed, then the storage appliance 300 recovers the data (via XOR operation with the parity chunk 328.

In the 7+1 RAID 5 configuration shown in FIG. 3, the parity overhead for the storage appliance 300 is 14% (SSD 318 stores parity chunks 328 for the 7 other SSDs 310-316), on top of the parity overhead for the ECC mechanism of each of the SSDs 310-316 and 318 (for example, 0.8% implementing the ECC mechanism of SSD 250 of FIG. 2). The parity overhead for the EC mechanism using the 7+1 RAID 5 configuration of the array of SSDs 310-316 and 318 of the storage appliance 300 is considerably larger than the parity overhead for the ECC mechanism of the individual SSDs 310-316 and 318. While isolating the ECC mechanisms of each of the SSDs 310-316 and 318 has its benefits supporting legacy storage devices, such as hard disk drives (HDDs), it is less efficient and consumes a large percentage of costly flash media when an array of SSDs 310-316 and 318 are used in the storage appliance 300.

Figure 4:
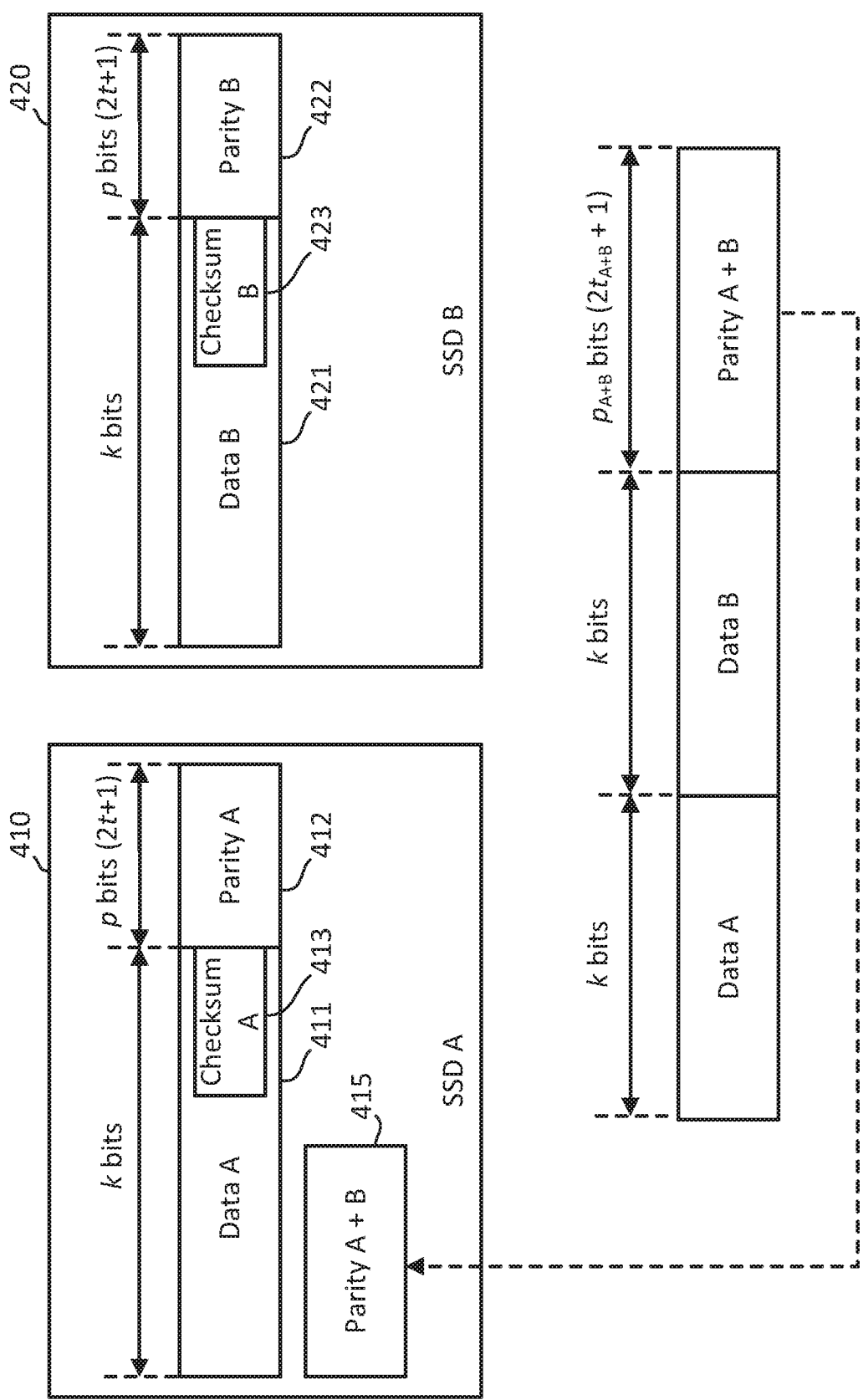
FIG. 4 is a block diagram of an extension of local ECC between two SSDs, according to an embodiment of the invention.

FIG. 4 is a block diagram of an extension of a local ECC mechanism between two SSDs 410 and 420, according to one embodiment of the invention. Both SSD A 410 and SSD B 420 are connected to a host device (not shown). In one embodiment, the host device may be a storage appliance comprising an array of SSDs, including SSD A 410 and SSD B 420. In another embodiment, SSD A 410 and SSD B 420 may be configured as a layer within a server, such as Linux's LVM or any other OS layer.

As shown in FIG. 4, SSD A 410 has k bits of data block A 411 (with checksum A 413) and p bits (2t+1) of parity A 412 stored in the pages of the NAND flash memory of SSD A 410. Similarly, SSD B 420 has k bits of data block B 421

(with checksum B 423) and p bits (2t+1) of parity B 422 stored in the pages of the NAND flash memory of the SSD B 420. SSD A 410 further includes an extended parity A+B 415. The extended parity A+B 415 is generated from the ECC encoding of the concatenated data block A 411 and data block B 421. Thus, the extended parity A+B 415 is generated from 2 k data bits (k bits of data block A 411+k bits of data block B 421). This way, extended parity A+B 415 is capable of recovering $t_{A+B}$ errored bits, where $t_{A+B}$>t. In one embodiment, parity A 412, parity B 422, and extended parity A+B 415 may comprise BCH parity bits. In other embodiments, the extended parity A+B 415 may comprise Hamming parity bits, Reed-Soloman parity bits, or LDPC bits.

In operation, when the data block A 411 is read from the NAND flash memory of SSD A 410, if the k bits of data block A 411 are recoverable (via ECC decoding using parity A 412, followed by CRC with checksum A 413), it is transmitted from SSD A 410 to the host device. If data block A 411 is not recoverable (i.e. the errored bits in data A 411 exceeds t bits, or the ECC scheme otherwise mis-decodes the data as detected by CRC fails), then data block A 411 is read without any ECC decoding applied (i.e. with errors) and data block B 421 is read from SSD B 420. Assuming SSD B 420 is capable of being read, i.e., its errors (if any) were corrected and verified via CRC, data block A 411 (with any errors) and data block B 421 are concatenated and decoded using extended parity A+B 415. If the concatenated data block A 411 and data block B 421 are recoverable (via ECC decoding using extended parity A+B 415), and data block A 411 passes CRC (via checksum 413), then data block A 411 is passed to the host device.

Thus, extended parity A+B 415 is capable of correcting an additional number of errored bits (up to $t_{A+B}$ bits) that is greater than the t error bits that parity A 412 alone is capable of correcting. So long as the number of errored bits in data block A 411 do not exceed $t_{A+B}$, then the data block A 411 can be successfully decoded. The checksum A 413 is also finally checked (via CRC) in case the number of errors does exceed $t_{A+B}$ and/or a false positive mis-decoding occurs.

In normal operation of the SSD A 410 and SSD B 420, the use of extended parity A+B 415 should be a relatively rare event, in instances where the data block A 411 cannot be properly decoded with parity A 412, i.e. the number of error bits is greater than t, or when the ECC mis-decodes This is because SSD ECC schemes are generally chosen such that t should be able to correct most of the error situations encountered during the lifetime of the SSD, and the errors should typically be confined to particular flash pages, rather than the entire NAND flash memory device. However, as noted, it may still be possible for ECC schemes to mis-decode, and for the CRC checksum to fail resulting in an unrecoverable error state. Using data block B 421 from SSD B 420 and extended parity A+B 415 to recover the data block A 411 when unrecoverable errors occur will be fairly robust as the data B 421 is stored in a different SSD B 420 from the data block A 411, and the likelihood that data block B 421 also suffers an unrecoverable error is small.

However, even in the event that data block B 421 suffers an unrecoverable error, data block B 421 may be read without any ECC decoding applied (i.e. with any errors) and then data block A 411 (with any errors) and data block B 421 (also with any errors) are concatenated and decoded using extended parity A+B 415. As long as the total number of errors in the concatenated data blocks does not exceed $t_{A+B}$ bits, extended parity A+B 415 is capable of correcting the errors in the concatenated data block, and thereby enables both data block A 411 and data block B 421 to be recovered after passing their respective CRC checksums.

To enable this form of extended ECC decoding, SSD A 410 and SSD B 420 provide the capability to read raw, uncorrected, data blocks A 411 or B 412 in the event that an unrecoverable error is returned by the SSDs. In one embodiment, this may be provided by the Open-Channel Light NVM kernel application programming interface (API) function nvm_flash_read. In another embodiment, reading the raw, uncorrected, data from an SSD by the host device can be performed using an extended API, using proprietary vendor-specific commands such as those provided in SATA, SCSI, or SAS protocols.

The extended parity A+B 415 may be stored in the same page of the NAND flash memory of SSD A 410 as data block A 411 and parity A 412, or in a different page. There will be certain trade-offs between either configuration. When the extended parity A+B 415 is stored in the same page as data block A 411 and parity A 412, only one page read is required to read the extended parity A+B 415 along with data block A 411 and parity A 412. However, if the flash page where the data block A 411 is stored is suffering a high error rate necessitating the use of extended parity A+B 415, then the extended parity A+B 415 stored on the same flash page may suffer from the same high error rate.

Conversely, while storing the extended parity A+B 415 on a different flash page than the data block A 411 and parity A 412 necessitates an additional page read, the likelihood that the flash page storing the extended parity A+B also suffers from the high error rate is low, increasing the likelihood that the extended parity A+B can be decoded without few errored bits, if any. In most circumstances, data integrity will have higher priority over the additional latency added to the read process for an extra page read, particularly where there is already additional latency to read data B 421 from SSD B 420 for performing the extended ECC scheme using extended parity A+B 415.

In other embodiments, the extended ECC scheme may be applied to more than two SSDs, and up to N number of SSDs (where N>2). In these embodiments, any combination of data blocks from the N number of SSDs are concatenated and a new extended parity for the combined data blocks is generated such that extended parity $P_{A+B+\ldots+N}$ can recover from $t_{A+B+\ldots+N}$>t errored bits in the combined data blocks. If a read command fails to recover the requested data block, the host device can read the data blocks from the N number of SSDs use to generate the extended parity $P_{A+B+\ldots+N}$, and can use the extended parity $P_{A+B+\ldots+N}$ in the same manner as described above with SSD A 410 and SSD B 420 to recover up to $t_{A+B+\ldots+N}$ errored bits in the requested data block.

In one embodiment, reading the extended parity from an SSD by the host device can be performed by a regular read command in the same way as data blocks are read. In another embodiment, reading the extended parity from an SSD can be performed with an appropriate read command which includes the reading of the metadata associated with logical block data, such as an NVM Express™ protocol read command, where the command parameters may include a Metadata Pointer (MPTR) for metadata in addition to the Scatter Gather List (SGL) address pointers for logical block data. In another embodiment, reading the extended parity from an SSD by the host device can be performed using an extended API, using proprietary vendorspecific commands such as those provided in SATA, SCSI or SAS protocols.

In one embodiment, the data blocks can be arranged in multiple groupings for implementing the extended ECC scheme. For example, a data block A from SSD A can be grouped with data block B from SSD B, generating an extended parity A+B from the concatenated data block A and data block B, and in another grouping, data block A from SSD A can also be grouped with data block C from SSD C, generating an extended parity A+C from the concatenated data block A and data block C. This way, if the data block A cannot be recovered with data block B and extended parity A+B, then the host may attempt to recover data block A using data block C and extended parity A+C.

The extended ECC scheme shown and described in FIG. 4 may be applied to the storage appliance 300 shown in FIG. 3 comprising an array of SSDs 310-316 and 318 to reduce the parity overhead. For example, assuming a pool of 8 SSDs 310-316 and 318, as shown in FIG. 3, where each SSD 310-316 and 318 applies a local BCH code (2108, 2048, 11), i.e. adding 60 bits for each 2 Kb of data within each of the SSDs 310-316 and 318 that corrects up to 5 bits, there will be a 3% parity overhead per SSD 310-316 and 318 for this 5 bit error correction. If we then apply the extended ECC scheme of FIG. 4, for example, taking a stripe of 8 chunks of 2048 bits from the pool of SSDs 310-316 and 318, and also apply a BCH code of the form (16534, 16384, 21), then we can correct up to 10 bits of the stripe of 8 chunks by only adding an additional 0.8% parity overhead per SSD 310-316 and 318. So one data chunk of one of the SSDs 310-316 and 318 can have up to 10 errored bits, and so long as the other data chunks of the other SSDs 310-316 and 318 have between 0-5 errored bits, the host device will be able to correct these errors and recover the desired data chunk with a minimal increase in parity overhead.

Figure 5:
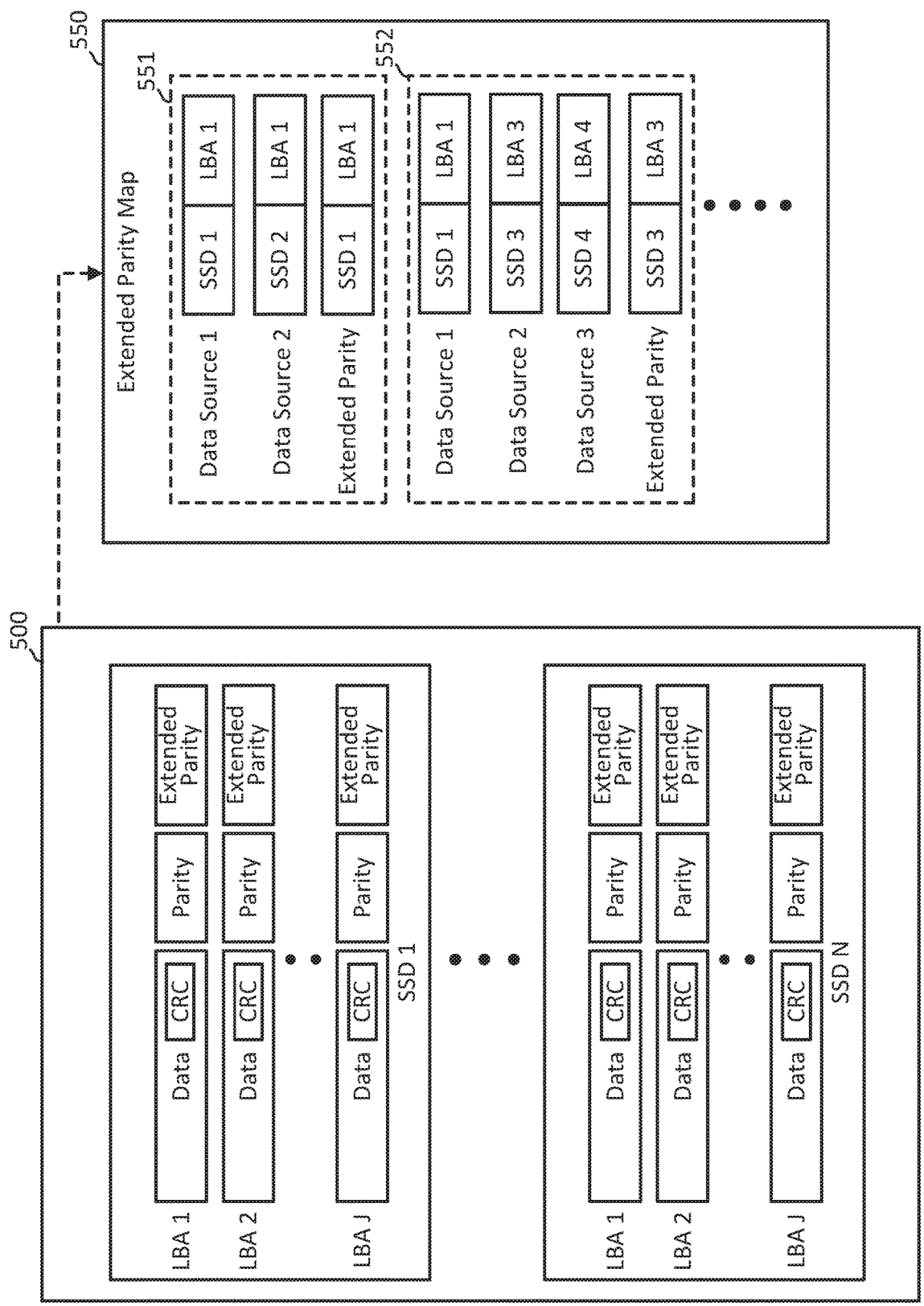
FIG. 5 is a block diagram of a pool-level ECC mechanism for an array of SSDs, according to an embodiment of the invention.

FIG. 5 is a block diagram of a pool-level ECC mechanism for an array of SSDs, according to one embodiment of the invention. As shown in FIG. 5, a storage appliance 500 comprises an array of SSDs, from SSD 1 to SSD N, where N is the number of SSDs within the storage appliance 500. In another embodiment, the array of SSDs 1 to N may be configured as a layer within a server, for example, in Linux's LVM or any other OS layer. Each of the SSDs 1 to N are configured to implement an internal ECC mechanism for each data block (including CRC), with parity, which are stored at LBA 1-J of the SSDs, where J is the number of LBAs of each of the SSDs 1-N. Each of the SSDs 1 to N are also configured to allow the storage appliance 500 to read raw, uncorrected, data blocks from the SSDs 1 to N in the event the internal ECC mechanism returns an unrecoverable error when reading an LBA 1-J. Additionally, the pool of SSDs 1 to N, are further configured to implement the extended (also may be referred to as pool-level or global) ECC scheme shown and described in FIG. 4 with extended parity. The storage appliance 500 may be any suitable type of storage appliance device, such as a simple Just a Bunch of Disks (JBOD)-type storage appliance or a storage appliance with a suitable virtualization layer of any kind.

The storage appliance 500 includes a controller that maintains an extended parity map 550. The parity map 550 includes groups 551, 552, and so on, of the extended parity used to implement the extend ECC scheme. For example, group 551 comprises the data block located at LBA 1 of SSD 1 as data source 1, and the data block located at LBA 1 of SSD 2 as data source 2. The extended parity for the concatenated data source 1 and data source 2 is located at LBA 1 of SSD 1.

Accordingly, when a read command for the data block located at LBA 1 of SSD 1 (data source 1) is received, if the local ECC of that data block is unable to recover the data (i.e. where the errored bits exceed t), then the storage appliance 500 controller first reads the raw data block (with errors) located at LBA 1 of SSD 1 and then the data block located at LBA 1 of SSD 2 (data source 2), along with the extended parity. And, assuming the latter are both read without any unrecoverable errors, then the raw data block located at LBA 1 of SSD 1 may be corrected and recovered using the data block located at LBA 1 of SSD 2 and the extended parity (assuming the errored bits in the raw data block do not exceed $t_{data\ source\ 1+data\ source\ 2}$). Even if the data block located at LBA 1 of SSD 2 (data source 2) and/or the extended parity return unrecoverable errors (in which case they are re-read in raw data form), as long as the total number of errored bits does not exceed $t_{data\ source\ 1+data\ source\ 2}$, then data block located at LBA 1 of SSD 1 may still be corrected and recovered, otherwise an unrecoverable error message is returned.

As shown in group 551, the extended parity is stored in the same location as data source 1 (LBA 1 of SSD 1). As previously discussed, this may result in the extended parity having a high number of errored bits itself, and in the case where the errored bits of the extended parity exceeds t, the extended ECC scheme of group 551 will not be able to recover the data block located at LBA1 of SSD 1. In another embodiment, the extended parity is stored at a different LBA than the data sources 1 and 2.

Similarly, group 552 comprises three data sources 1-3, the first data block being located at LBA 1 of SSD 1, the second data block being located at LBA 3 of SSD 3, and the third data block being located at LBA 4 of SSD 4. The extended parity for group 552 is located at LBA 3 of SSD 3. Here the extended parity is capable of correcting $t_{data\ source\ 1+data\ source\ 2+data\ source\ 3}$ errored bits should a read of any of the first, second, or third data blocks exceed the t bit error correcting capability of the local ECC scheme used for each of the data blocks.

Moreover, the first data block located at LBA 1 of SSD 1 is a member of both groups 551 and 552. As previously discussed in connection with FIG. 4, if the first data block at LBA 1 of SSD 1 is unable to be recovered by the extended parity of group 551, for example, the errored bits of the first data block exceeds $t_{data\ source\ 1+data\ source\ 2}$, then the extended parity of group 552 may be used to recover the first data block, assuming the errored bits do not exceed $t_{data\ source\ 1+data\ source\ 2+data\ source\ 3}$, and data blocks two (located at LBA 3 of SSD 3) and three (located at LBA 4 of SSD 4) and the extended parity of group 552 are able to be read.

In one embodiment, the controller of the storage appliance groups data blocks, generates the extended parities, and updates the extended parity map 550 as incoming write commands to the array of SSDs 1 to N are received. In one embodiment, if a read command to a data block fails, the storage appliance 500 controller reads the corresponding data block(s) of the group or groups to which the data block belongs, along with the corresponding extended parity, and recovers the data block using the extended parity. In one embodiment, when executing an update command (i.e., writing of new data), the storage appliance 500 controller is responsible for updating using an extended API, either by recalculating or by removing the appropriate groups from the extended parity map 550. In one embodiment, the updating of the extended parity may be done at the same time as the writing of new data, which may slow down the speed at which data may be updated. In another embodiment, the updating of extended parity may be done at a later time, enabling the speed at which data may be updated not to be affected.

Figure 6:
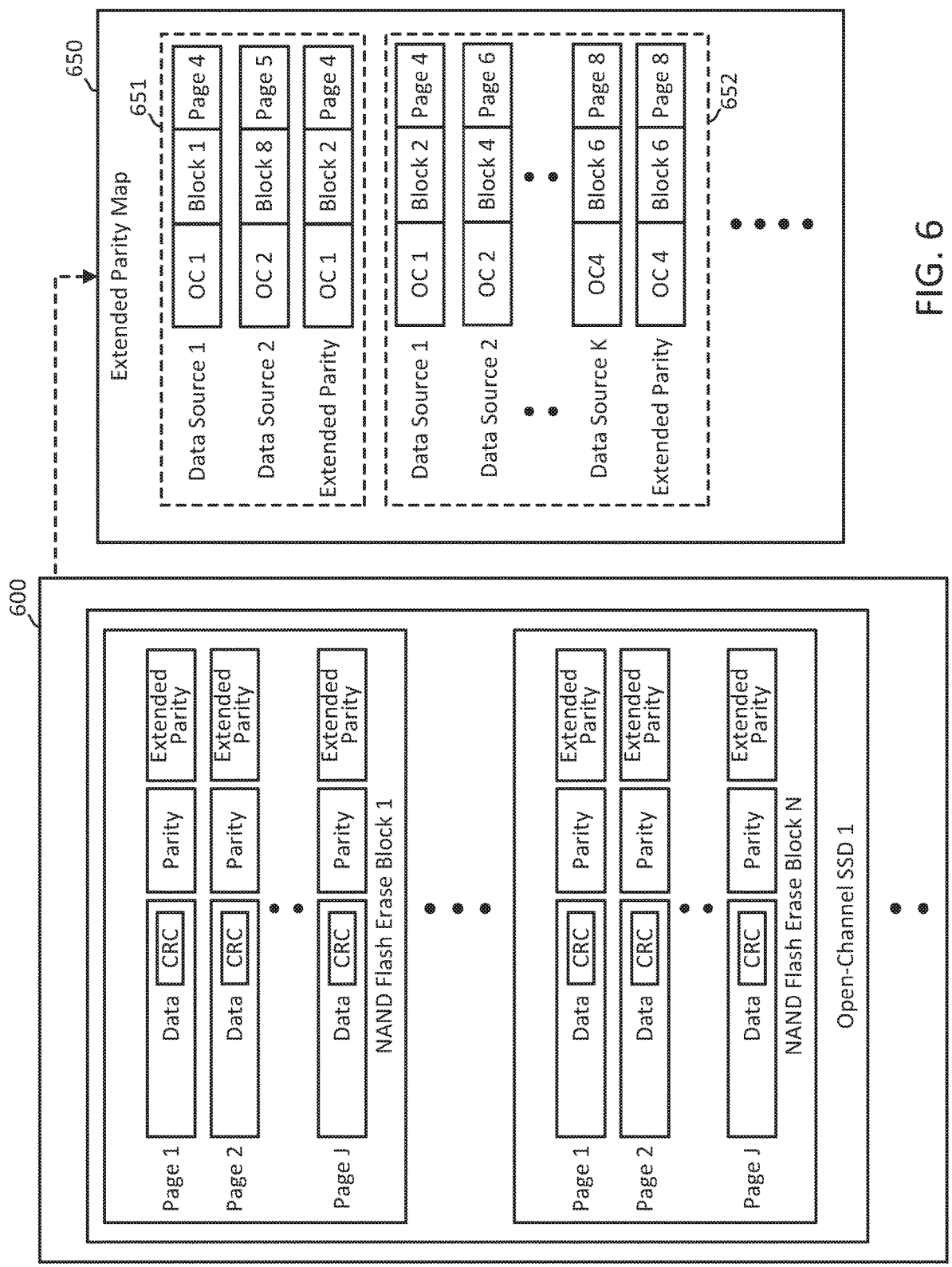
FIG. 6 is a block diagram of a pool-level ECC mechanism for an array of open-channel SSDs, according to an embodiment of the invention.

FIG. 6 is a block diagram of a pool-level ECC mechanism for an array of open-channel SSDs, according to one embodiment of the invention. As previously mentioned, an open-channel SSD may leave certain aspects of the management of the flash memory devices to the host device to which the open-channel SSD is connected. Typically, an open-channel SSD advertises through the Identify Device command what functions it offers and which of those may be provided by the host, and whether it operates in a "normal" mode (for example, where the logical to physical (L2P) map resides in the host device) or "hybrid mode" (for example, where the L2P map resides in the open-channel SSD).

The storage appliance 600 comprises a plurality of open-channel SSDs. While FIG. 6 shows a single open-channel SSD 1 within the storage appliance 600 for simplicity and ease of understanding, it should be readily apparent to those skilled in the art that the storage appliance 600 may comprise M open-channel SSDs where M>1. In another embodiment, the array of SSDs 1 to M may be configured as a layer within a server, for example, in Linux's LVM or any other OS layer. In one embodiment, the open-channel SSDs of the storage appliance 600 contain only the lower level of flash management, which mainly includes the local ECC and NAND physical access functions. The FTL is handled by the storage appliance 600's controller. Each open-channel SSD 1 to M of the storage appliance 600 comprises a plurality of NAND flash erase blocks 1 to N, where N is the number of NAND flash erase blocks of each SSD 1 to N. Each of the NAND flash erase blocks comprise J flash pages. Each flash page of a given NAND flash erase block contains data blocks (including CRC), and the associated parity for local ECC. The flash pages may also contain the extended parity used in the extended ECC scheme of the storage appliance 600.

Similar to the storage appliance 500 shown and described in FIG. 5, the storage appliance 600's controller maintains an extended parity map 650 that comprises the locations of groups 551, 552, and so on and so forth, of data blocks and their corresponding extended parity to implement the extended ECC scheme. As shown in FIG. 6, group 651 comprises the data block located at NAND flash erase block 1, page 4 of open channel SSD (OC) 1 as data source 1, and the data block located at NAND flash erase block 8, page 5 of OC 2 as data source 2. The extended parity for the concatenated data source 1 and data source 2 is located at NAND flash erase block 2, page 4 of OC 1.

Accordingly, as with storage appliance 500 of FIG. 5, when a read command for the data block located at NAND flash erase block 1, page 4 of OC1 (data source 1) is received, if the local ECC of that data block is unable to recover the data (i.e. where the errored bits exceed t), then the storage appliance 600 controller first reads the raw data block located at NAND flash erase block 1 (using, for example, the nvm_flash_read function) and then reads the data block located at NAND flash erase block 8, page 5 of OC 2 (data source 2), along with the extended parity. And, assuming both are read without any issues, such as also having errored bits exceeding t, respectively, then the data block located at NAND flash erase block 1, page 4 of OC 1 may be recovered (assuming the errored bits do not exceed $t_{data\ source\ 1+data\ source\ 2}$). As with storage appliance 500 of FIG. 5, even if the data block located at NAND flash erase block 8, page 5 of OC 2 (data source 2), and/or extended parity return unrecoverable errors (in which case they are re-read in raw data form), as long as the total number of errored bits does not exceed $t_{data\ source\ 1+data\ source\ 2}$, then the data block located at NAND flash erase block 1 may still be corrected and recovered, otherwise an unrecoverable error message is returned.

As shown in group 651, the extended parity is stored in a different location of OC 1 as the data blocks, increasing the reliability of the extended ECC scheme as the extended parity is not stored in the same high-error NAND flash erase block or page as the data block with errored bits exceeding the recovery capabilities of the local ECC. In another embodiment, the extended parity may be stored in the same NAND flash erase block or page as one of the corresponding data blocks of the group 651 to decrease the latency of the extended ECC scheme.

Similarly, group 652 comprises up to K data sources, the first data block being located at NAND flash erase block 2, page 4 of OC 1 (data source 1), the second data block being located at NAND flash erase block 4, page 6 of OC 2 (data source 2), and the $K^{th}$ data block being located at NAND flash erase block 6, page 8 of OC 4 (data source K). The extended parity for group 652 is located at NAND flash erase block 6, page 8 of OC 4. Here the extended parity is capable of correcting $t_{data\ source\ 1+data\ source\ 2+\ldots+data\ source\ k}$ errored bits should a read of any of the first, second, or $K^{th}$ data blocks exceed the t bit error correcting capability of the local ECC scheme used for each of the data blocks.

As shown in FIG. 6, the extended parity for group 652 is located in the same NAND flash erase block and flash page as data source K. In another embodiment, the extended parity is located in a different NAND flash erase block and flash page than the data sources of the group to increase the reliability of the extended ECC scheme.

Figure 7:
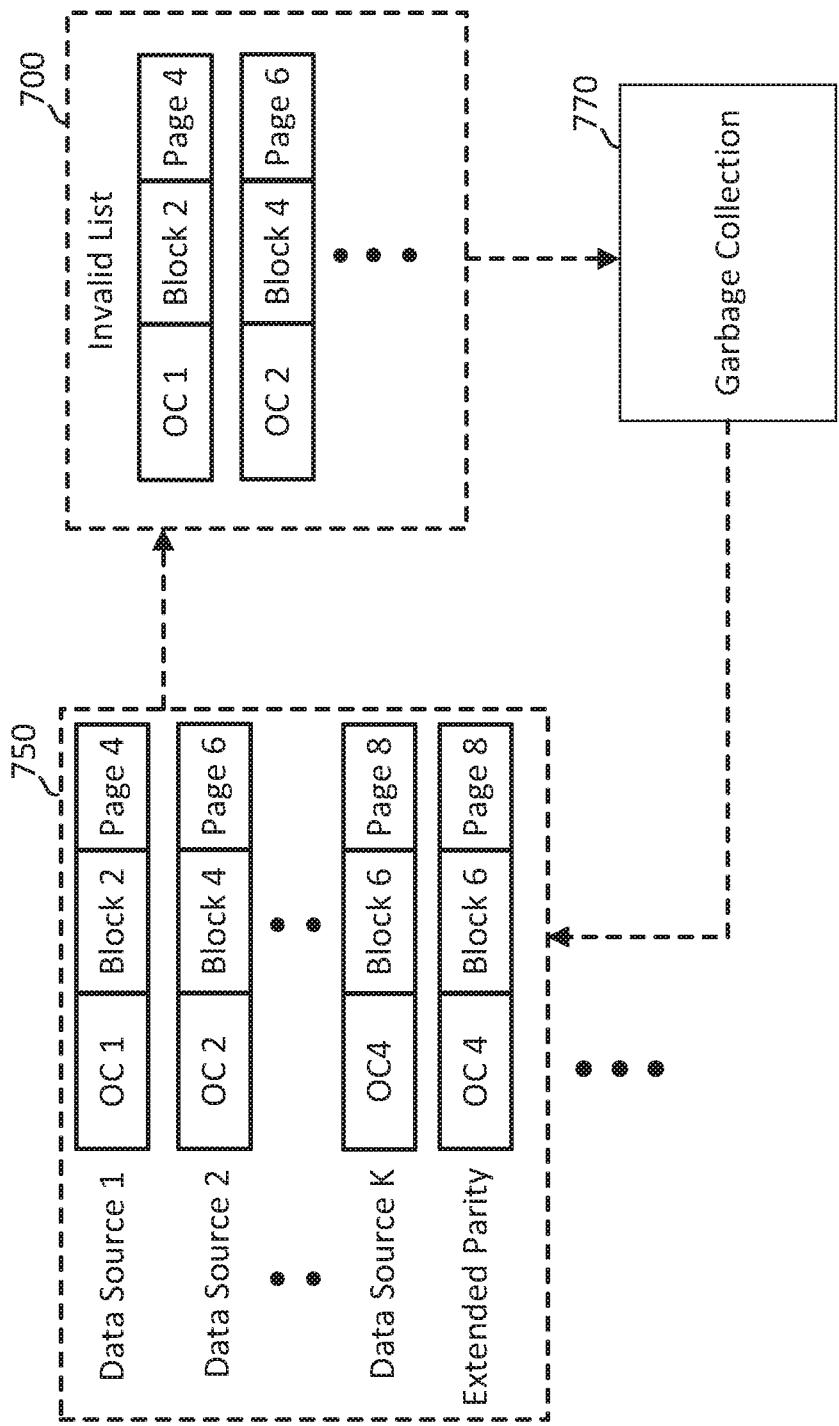
FIG. 7 is a block diagram of a global ECC integrated in a global FTL for an array of open-channel SSDs, according to an embodiment of the invention.

Given that the storage appliance 600 comprises an array of open-channel SSDs 1 to N, some or all of the FTL functionality may be implemented by the storage appliance 600. For example, data can be re-written to an address by writing the data to a new location and the data in the old location is marked as invalid. Later, a garbage collection process evicts invalid pages. FIG. 7 is a block diagram of a global ECC integrated in a global FTL for an array of open-channel SSDs, such as within the storage appliance 600 of FIG. 6, according to one embodiment of the invention. As shown in FIG. 7, the extended parity map 750 may be integrated with the global FTL operation for the array of open-channel SSDs. Here, the extended parity map 750 contains the locations of a group of K data sources, along with a corresponding extended parity for the group. If one of the data sources in the group, such as data source 1 located at NAND flash erase block 2, page 4 of OC 1, is rewritten, the new data corresponding to data source 1 is written to a new location and the old location of the data source 1 is marked as invalid and added to the invalid list 700. Garbage collection 770 then clears the invalid list 700. In one embodiment, when the garbage collection 770 is performed, the extended parity is regenerated with the new data. In another embodiment, when the garage collection 770 is performed, the group is also deleted. In this embodiment, unlike SSD environments where a change of data requires the deletion of the concatenated pages, the group can remain valid until garbage collection 770 is performed, as new data is written to a different location.

Figure 8:
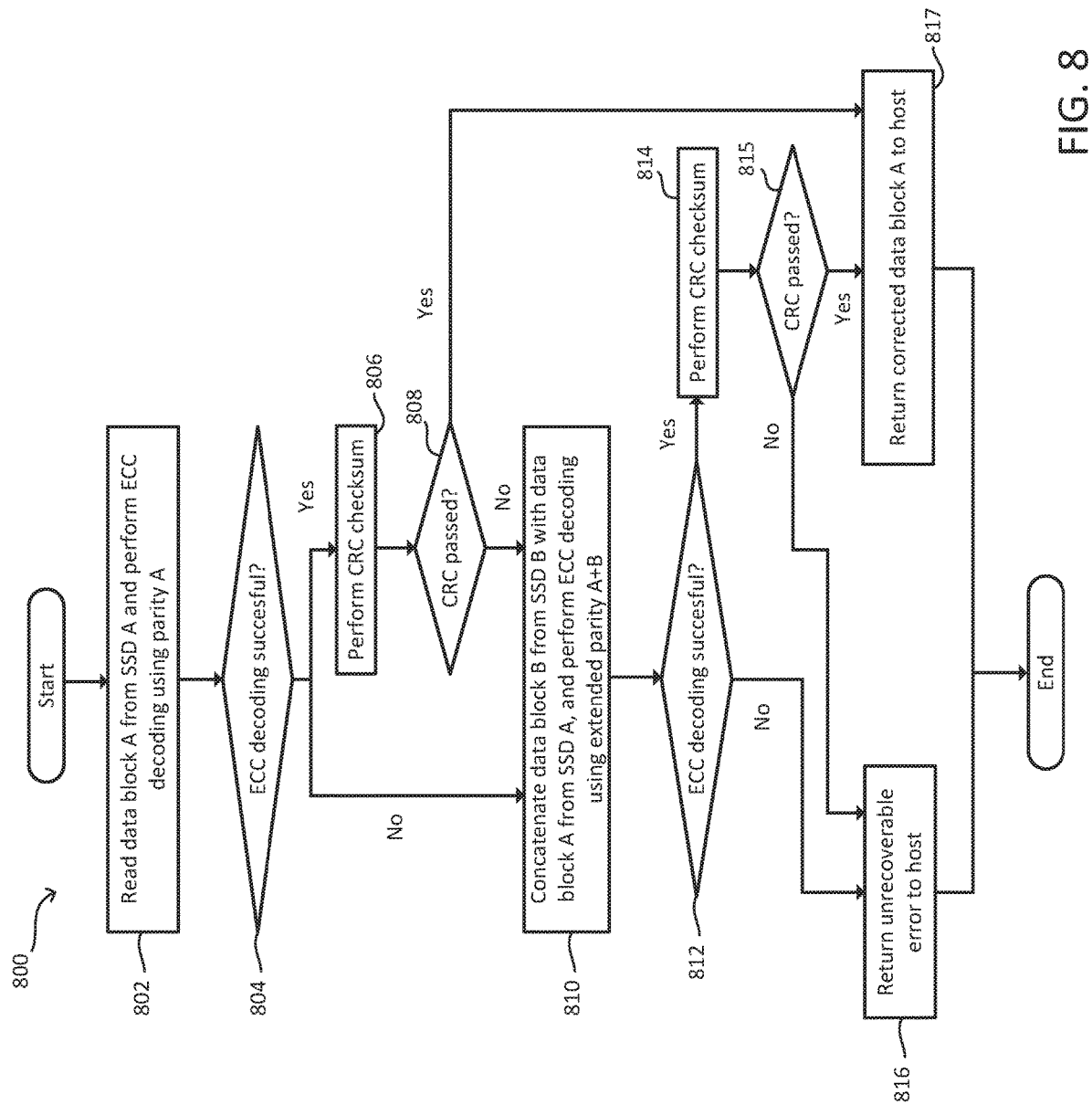
FIG. 8 is a flowchart of method steps for performing error correction for a plurality of SSDs, according to an embodiment of the invention.

FIG. 8 is a flowchart of method steps 800 for performing error correction for a plurality of SSDs, according to one embodiment of the invention. At step 802, data block A of SSD A is read from the NAND flash memory of SSD A. At step 804, local ECC is performed by SSD A. At step 806, if local ECC is successful (i.e. the number of errored bits in data block A is less than the number of bits correctible by parity A), CRC checksum is used to verify data block A was decoded properly.

If, at step 808, the CRC checksum passed, then the corrected data block A is returned to the Host at step 817. Otherwise, if the CRC checksum failed at step 808 or ECC decoding was unsuccessful at step 804, then at step 810 data block A is read without any ECC decoding applied (i.e. with errors) and data block B is read from SSD B. Data block B may be read using the same error correction steps 802-808 as data block A. If data block B fails ECC decoding or CRC checksum, then data block B can be read without any ECC decoding applied similar to data block A. Data block A and data block B are concatenated and decoded using extended parity A+B by the host.

In one embodiment SSD A and SSD B provide the host the capability of reading raw, uncorrected data blocks A and/or B in the event the local ECC of SSDs A and/or B, respectively, are unable to properly decode the data blocks. In one embodiment, this capability may be provided by the Open-Channel Light NVM kernel API function nvm_flash_read. In another embodiment, reading the raw, uncorrected, data from SSDs A and/or B by the host can be performed using an extended API, using propriety vendor-specific commands such as those provided in SATA, SCSI, or SAS protocols.

At step 812, if ECC decoding of concatenated data blocks A and B using extended parity A+B is successful (i.e. the number of errored bits in data blocks A and B is less than the number of bits correctible by parity A+B), at step 814 CRC checksum is used to verify data block A was decoded correctly. If, at step 815, the CRC checksum passes successfully, then the corrected data block A is returned to the host at step 817. Otherwise, at step 816, an unrecoverable error is returned to the host. While the method steps 800 for performing error correction is shown and described in connection with two data blocks A and B from two SSDs A and B, in other embodiments, the method steps 800 may be performed using more than two data blocks on two or more SSDs. In these embodiments, any combination of data blocks from the two or more SSDs can be concatenated, and using an extended parity that includes all of those data blocks, the number of errored bits that can be corrected is correspondingly greater than what is possible with extended parity A+B or parity A, alone.

In another embodiment, the method steps 800 may be extended such that if ECC decoding at step 812 is not successful, then the host reads a number N of additional blocks, concatenates those N additional data blocks with data blocks A and B, and performs ECC decoding using extended parity A+B+ . . . +N additional blocks. If ECC decoding with extended parity A+B+ . . . +additional blocks is successful, then the corrected data block A is returned to the host. In another embodiment, the method steps 800 may be extended such that if ECC decoding at step 812 is not successful, then the host reads a different data block (other than data block B of SSD B) and concatenates that different data block with data block A and performs ECC decoding using the extended parity of data block A and the different data block. These extended method steps can be repeated with increasing N data blocks or different data blocks until the ECC decoding with extended parity is successfully completed and corrected data block A is returned to the host.

Other objects, advantages and embodiments of the various aspects of the present invention will be apparent to those who are skilled in the field of the invention and are within the scope of the description and the accompanying Figures. For example, but without limitation, structural or functional elements might be rearranged, or method steps reordered, consistent with the present invention. Similarly, principles according to the present invention could be applied to other examples, which, even if not specifically described here in detail, would nevertheless be within the scope of the present invention.

What is claimed is:

1. A method for storing and protecting data in a plurality of storage devices, the method comprising:
generating a first parity data based on a first set of data, the first parity data capable of correcting a first maximum number of error bits in the first set of data;
storing the first parity data and the first set of data on a first storage device of the plurality of storage devices at a first logical block address;
storing a second set of data on a second storage device of the plurality of storage devices at a second logical block address;
generating a second parity data based on a combination of the first set of data and the second set of data, the second parity data capable of correcting a second maximum number of error bits of data, the second maximum number being greater than the first maximum number; and
storing the second parity data at the first logical block address or the second logical block address.

2. The method of claim 1, the method further comprising:
attempting to correct an error in the first set of data using the first parity data; and
determining whether or not the attempt to correct the error in the first set of data is successful.

3. The method of claim 2, further comprising:
configuring the first set of data to indicate whether or not the first set of data has been corrected using the first parity data.

4. The method of claim 2, further comprising:
in response to determining that the attempt was not successful, correcting the error within the first set of data using the second set of data and the second parity data.

5. The method of claim 2, further comprising:
in response to determining that a successful attempt to correct the error within the first set of data is a false-positive, correcting the error within the first set of data using the second set of data and the second parity data.

6. The method of claim 1, further comprising:
generating a mapping table containing locations within the plurality of storage devices of the first set of data, the second set of data corresponding to the combination of the first set of data and the second set of data used to generate the second parity data, and the second parity data.

7. The method of claim 1, further comprising:
storing the first set of data and the first parity data in a first location within one or more memory devices of the at least one of the plurality of storage devices; and
storing the second parity data in a second location within one or more memory devices of the plurality of storage devices.

8. The method of claim 7, wherein the first location and the second location correspond to different flash pages within the one or more flash memory devices of the plurality of storage devices.

9. The method of claim 1, wherein the plurality of storage devices comprise SSDs or memory devices.

10. The method of claim 1, wherein the first and second parity data are Bose-Chaudhuri-Hocquenghem, Hamming, Reed-Soloman, or low-density parity check (LDPC) parity data.

11. The method of claim 1, wherein the first storage device and the second storage device are part of a same storage device.

12. The method of claim 1, wherein the method for storing and protecting data in a plurality of storage devices is performed by a controller associated with the plurality of storage devices.

13. A storage appliance comprising:
a controller communicatively coupled to a plurality of storage devices, wherein the controller is configured to:
generate a first parity data based on a first set of data, the first parity data capable of correcting a first maximum number of error bits in the first set of data;
store the first parity data and the first set of data on a first storage device of the plurality of storage devices at a first logical block address;
store a second set of data on a second storage device of the plurality of storage devices at a second logical block address;
generate a second parity data based on a combination of the first set of data and the second set of data, the second parity data capable of correcting a second maximum number of error bits of data, the second maximum number being greater than the first maximum number; and
store the second parity data at the first logical block address or the second logical block address.

14. The storage appliance of claim 13, wherein the controller is further configured:
to attempt to correct an error in the first set of data using the first parity data; and
determine whether or not the attempt to correct the error in the first set of data is successful.

15. The storage appliance of claim 14, wherein the controller is further configured to:
in response to determining that the attempt to correct the error within the first set of data was not successful, correcting the error within the first set of data using the second set of data and the second parity data.

16. The storage appliance of claim 14, wherein the controller is further configured to:
in response to determining that a successful attempt to correct the error within the first set of data is a false-positive, correcting the error in the first set of data using the second set of data and the second parity data.

17. The storage appliance of claim 13, wherein the controller is further configured to:
configure the first set of data to indicate whether or not the first set of data has been corrected using first parity data.

18. The storage appliance of claim 13, wherein the controller is configured to:
store and update a mapping table containing locations within the plurality of storage devices of the first set of data and the at least one second set of data corresponding to the combination of the first set of data and the second set of data used to generate the second parity data, and the second parity data.

19. The storage appliance of claim 18, wherein the first location and the second location correspond to different flash pages within the one or more flash memory devices of the plurality of storage devices.

20. The storage appliance of claim 13, wherein the first set of data and the first parity data are stored in a first location within one or more memory devices of the at least one of the plurality of storage devices, and the second parity data are stored in a second location within one or more memory devices of the plurality of storage devices.

21. The storage appliance of claim 13, wherein the plurality of storage devices comprise SSDs or memory devices.

22. The storage appliance of claim 13, wherein the first and second parity data are Bose-Chaudhuri-Hocquenghem, Hamming, Reed-Soloman, or low-density parity check (LDPC) parity data.

23. The storage appliance of claim 13, wherein the first storage device and the second storage device are part of a same storage device.

* * * * *